United States Patent [19]
Fukunaga et al.

[11] Patent Number: 5,917,359
[45] Date of Patent: *Jun. 29, 1999

[54] SEMICONDUCTOR APPARATUS HAVING PROTECTIVE CIRCUITRY

[75] Inventors: Masanori Fukunaga; Shoichi Orita, both of Tokyo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/671,545

[22] Filed: Jun. 27, 1996

[30] Foreign Application Priority Data

Jan. 12, 1996 [JP] Japan ................................. 8-004228

[51] Int. Cl.$^6$ ..................................................... H03K 17/16
[52] U.S. Cl. .............................................. 327/381; 327/18
[58] Field of Search ................................. 327/18, 19, 20, 327/333, 379, 381, 383, 384, 389, 391, 538, 540, 541, 543, 544, 545, 546; 361/18, 88, 91; 363/50, 55, 56; 326/63, 80, 81

[56] References Cited

U.S. PATENT DOCUMENTS

| | | | |
|---|---|---|---|
| 4,315,168 | 2/1982 | Ohhinata | 327/381 |
| 4,705,962 | 11/1987 | Kinoshita et al. | 327/381 |
| 5,105,099 | 4/1992 | Routh et al. | 327/384 |
| 5,187,632 | 2/1993 | Blessing | 361/103 |
| 5,351,182 | 9/1994 | Miyazaki et al. | 363/132 |
| 5,514,981 | 5/1996 | Tam et al. | 326/80 |

FOREIGN PATENT DOCUMENTS

| | | |
|---|---|---|
| 195 03 375 | 9/1995 | Germany . |
| 4-230117 | 8/1992 | Japan . |
| 2 244 400 | 11/1991 | United Kingdom . |

*Primary Examiner*—My-Trang Nu Ton
*Attorney, Agent, or Firm*—Oblon, Spivak, McClelland, Maier & Neustadt, P.C.

[57] ABSTRACT

The drain electrodes of HNMOS transistors (2) and (3) are connected to the first ends of resistors (4) and (5), and to the inputs of inverter circuits (6) and (7) respectively. The outputs of the inverter circuits (6) and (7) are connected to the inputs of a protection circuit (27). The outputs of the protection circuit (27) are connected to the set and reset inputs of a flip-flop circuit (10A). The protection circuit (27) serves to prevent the malfunction of the flip-flop circuit (10A) from occurring and is formed by a logic gate. Having this configuration high potential side power device driving circuit is provided wherein the pulse widths of signals input to the gate electrodes of transistors for level shift can be set optionally, the lag time of the signal is not caused by a passage through a filter circuit, and the malfunction of a flip-flop circuit can be prevented from occurring due to a dv/dt current without lowering the response performance of a power device.

10 Claims, 8 Drawing Sheets

FIG. 3A
INPUT (ON SIGNAL)

FIG. 3B
INPUT (OFF SIGNAL)

FIG. 3C
Q OUTPUT
(WITH PROTECTION CIRCUIT)

FIG. 3D
Q OUTPUT
(WITHOUT PROTECTION CIRCUIT)

FIG. 10A
(BACKGROUND ART)
INPUT(ON SIGNAL)

FIG. 10B
(BACKGROUND ART)
ON SIDE CR
FILTER OUTPUT

FIG. 10C
(BACKGROUND ART)
INPUT(OFF SIGNAL)

FIG. 10D
(BACKGROUND ART)
OFF SIDE CR
FILTER OUTPUT

FIG. 10E
(BACKGROUND ART)
Q OUTPUT

SEMICONDUCTOR APPARATUS HAVING PROTECTIVE CIRCUITRY

BACKGROUND OF THE INVENTION

1. Field of the Invention

The present invention relates to a semiconductor apparatus, and more particularly to a driving circuit of a power device in which a malfunction is prevented from occurring due to a dv/dt transient signal.

2. Description of the Background Art

Figure 8:
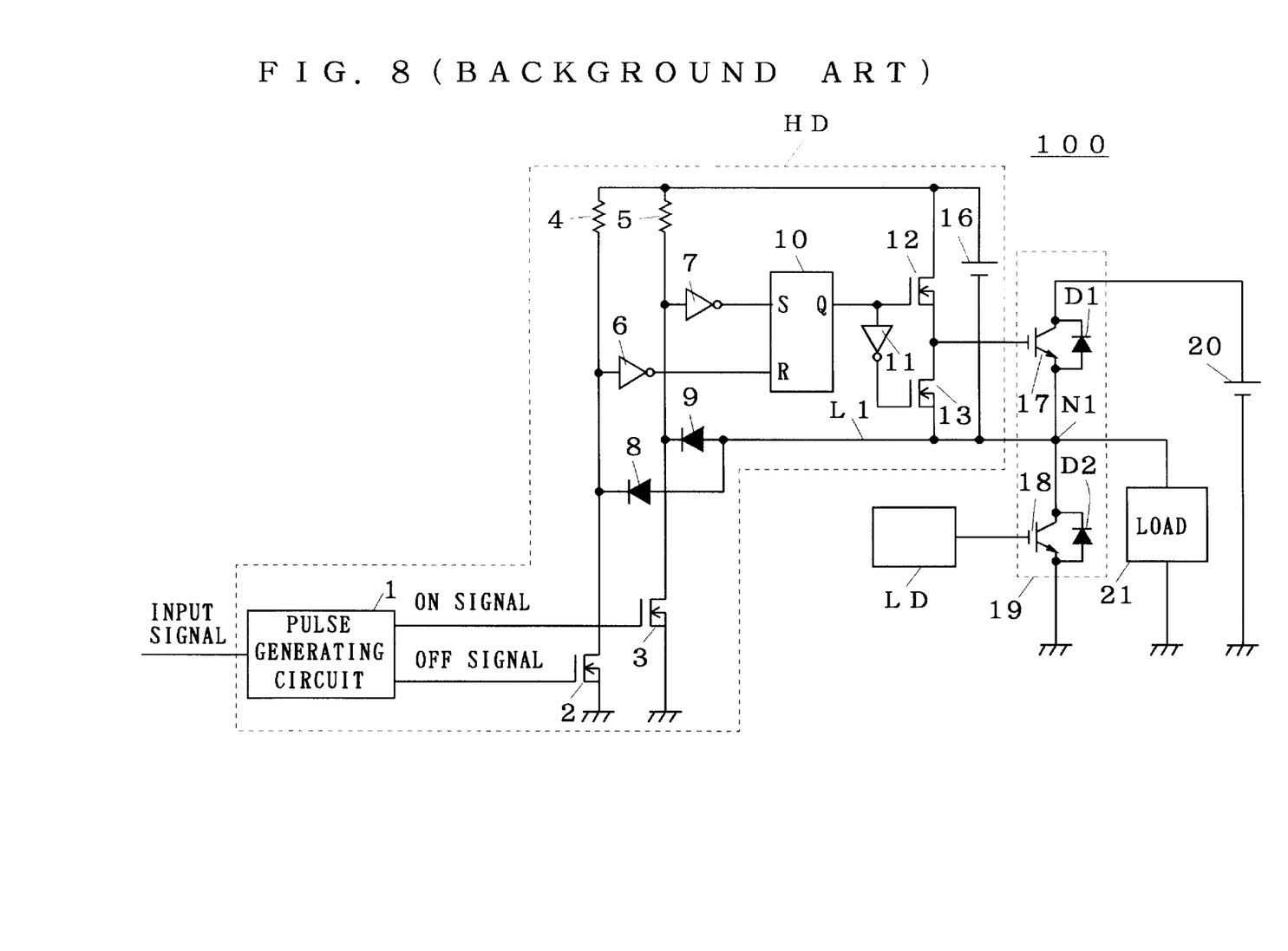
FIG. 8 is a diagram showing the structure of a semiconductor apparatus according to the prior art.

FIG. 8 shows the structure of a driving circuit 100 of a power device according to the prior art. In FIG. 8, power devices 17 and 18 such as IGBTs (insulated gate bipolar transistors) are Totem-pole connected between a source potential VDD and a ground potential GND so that a half bridge type power device 19 is formed. Free-wheel diodes D1 and D2 are connected to the power devices 17 and 18 in antiparallel. A load (an inductive load such as a motor) 21 is connected to a node N1 of the power devices 17 and 18.

In FIG. 8, when the potential of the node N1 of the power devices 17 and 18 acts as a reference potential, the power device 17 performs switching operation between the reference potential and the source potential VDD supplied from a power source 20. The power device 17 will be hereinafter referred to as a high potential side power device.

When the ground potential acts as a reference potential, the power device 18 performs switching operation between the reference potential and the potential of the node N1. The power device 18 will be hereinafter referred to as a low potential side power device.

Accordingly, the driving circuit 100 of the power device shown in FIG. 8 is divided into a high potential side power device driving circuit HD and a low potential side power device driving circuit LD. Since the low potential side power device driving circuit LD is hardly related to the present invention, the description will be omitted.

The structure of the high potential side power device will be described below. Two outputs of a pulse generating circuit 1 are connected to the gate electrodes of high breakdown voltage field effect transistors (hereinafter referred to as HNMOS transistors) 2 and 3 which act as level shift transistors. The pulse generating circuit 1 generates pulse-shaped ON and OFF signals in response to an input signal sent from a microcomputer or the like which is provided on the outside. The drain electrodes of the HNMOS transistors 2 and 3 are connected to the first ends of resistors 4 and 5 and to the inputs of inverter circuits 6 and 7 respectively.

The outputs of the inverter circuits 6 and 7 are connected to the reset and set inputs of a non-inverted input type flip-flop circuit 10. The Q output of the flip-flop circuit 10 is connected to the gate electrode of an NMOS transistor 12 and to the input of an inverter circuit 11. The output of the inverter circuit 11 is connected to the gate electrode of an NMOS transistor 13.

The second ends of the resistors 4 and 5 are connected to the drain electrode side of the NMOS transistor 12, that is, the positive potential output of a high potential side power source 16. The source electrode of the NMOS transistor 13, that is, the negative potential output of the high potential side power source 16 is connected to the anodes of diodes 8 and 9. The cathodes of the diodes 8 and 9 are connected to the source electrodes of the HNMOS transistors 2 and 3 respectively.

Referring to the high potential side power device driving circuit HD, a fast dv/dt transient signal is generated on a line (hereinafter referred to as a line L1) which is provided from the node N1 to the anodes of the diodes 8 and 9 depending on the switching state of the half bridge type power device 19. Since a parasitic electrostatic capacity C is present between the drain-source of the HNMOS transistors 2 and 3, a current (hereinafter referred to as a dv/dt current) which is obtained by integration of the parasitic electrostatic capacity C and the dv/dt transient signal flows to the HNMOS transistors 2 and 3 at the same time.

The dv/dt current which flows to the HNMOS transistors 2 and 3 has the same level as that of a current which flows during normal switching. Consequently, a voltage drop occurs to the resistors 4 and 5 at the same time so that a "H" signal is sent to the set and reset inputs of the flip-flop circuit 10 simultaneously. In general, it is prohibited that the "H" signal is input to the set and reset inputs of the non-inverted input type flip-flop circuit at the same time. The reason is that unpredictable operation, that is, a malfunction is caused.

In order to prevent such a malfunction from occurring, it is required that the resistance values of the resistors 4 and 5 and the ON-state resistances of the HNMOS transistors 2 and 3 should be set with very high precision in such a manner that the voltage drop of the resistors 4 and 5 caused by the dv/dt transient signal can be distinguished from the voltage drop caused by a signal sent from the pulse generating circuit 1. Consequently, the ability to prevent the malfunction is limited.

A driving circuit 100A of the power device in which a filter circuit using a resistor and a capacitor or a capacity component is added to the first stage of the input of the flip-flop circuit 10 has been devised. The high potential side power device driving circuit HD1 of the driving circuit 100A of the power device will be described below with reference to FIG. 9. The same reference numbers designate the same structure as that of the driving circuit 100 of the power device described above with reference to FIG. 8, and the same description will not be repeated.

Figure 9:
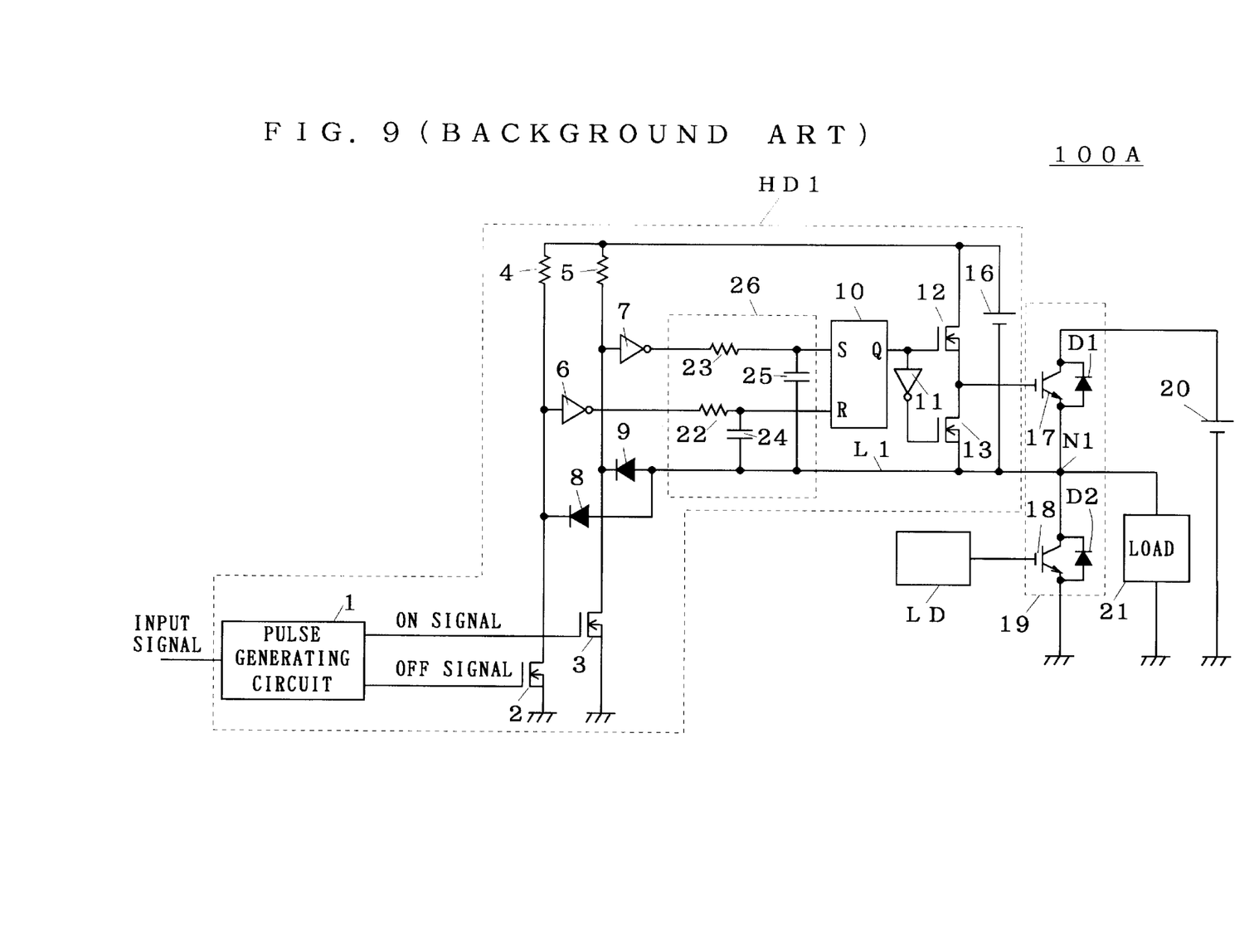
FIG. 9 is a diagram showing the structure of a semiconductor apparatus having a CR filter circuit according to the prior art.
Figure 10A:
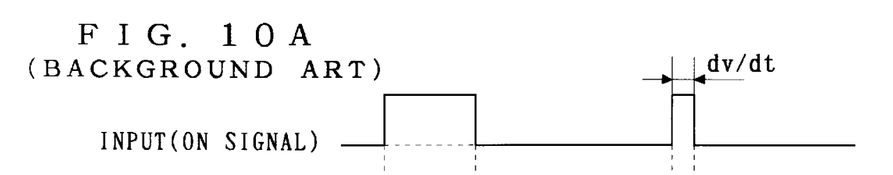
FIG. 10A to FIG. 10E are timing charts showing the operation of the semiconductor apparatus having the CR filter circuit according to the prior art.
Figure 10B:
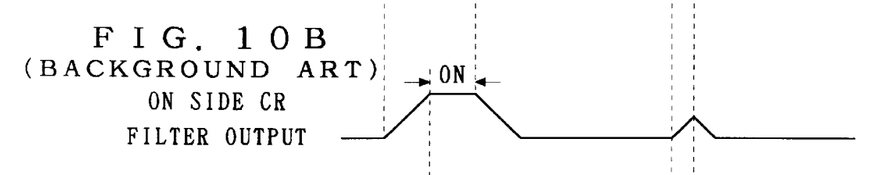
Figure 10C:
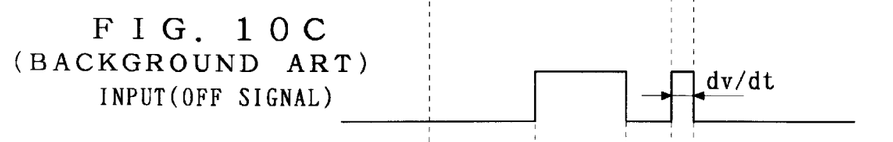
Figure 10D:
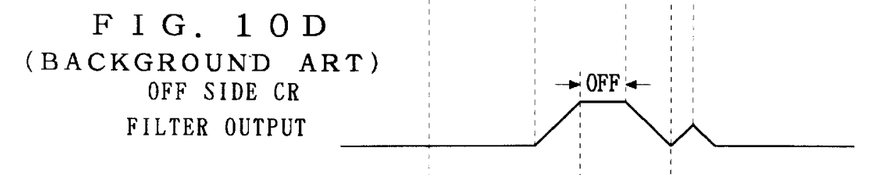
Figure 10E:
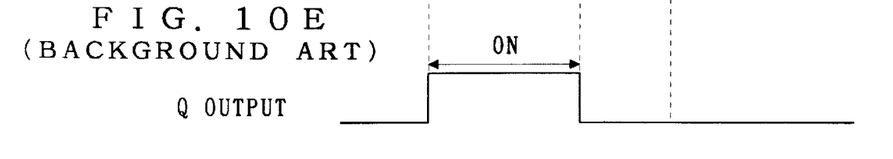

In FIG. 9, a resistor 22 is inserted between the output of the inverter circuit 6 and the reset input of the flip-flop circuit 10, and a resistor 23 is inserted between the output of the inverter circuit 7 and the set input of the flip-flop circuit 10. A capacitor 24 is inserted between the line L1 and the reset input of the flip-flop circuit 10, and a capacitor 25 is inserted between the line L1 and the set input of the flip-flop circuit 10 so that a filter circuit 26 is formed.

The operation of the high potential side power device driving circuit HD1 will be described below with reference to FIG. 9.

When a dv/dt transient signal is applied to the line L1 depending on the switching state of the half bridge type power device 19, a dv/dt current flows to the HNMOS transistors 2 and 3 at the same time so that a voltage drop occurs to the resistors 4 and 5 simultaneously. Consequently, the "H" signal is output from the inverter circuits 6 and 7. However, the "H" signal is not input to the flip-flop circuit 10 until a predetermined time (hereinafter referred to as a lag time) that is set by the time constant of a CR filter (hereinafter referred to as an OFF side CR filter because it is connected to the HNMOS transistor 2 to which an OFF signal is input) formed by the capacitor 24 and the resistor 22 connected to the inverter circuit 6 and a predetermined time that is set by the time constant of a CR filter (hereinafter referred to as an ON side CR filter because it is connected to the HNMOS transistor 3 to which an ON signal is input) formed by the capacitor 25 and the resistor 23 connected to the inverter circuit 7 pass.

By setting the lag time greater than the application time for the dv/dt transient signal, the "H" signal generated by the dv/dt current is not sent to the flip-flop circuit 10 so that the malfunction of the flip-flop circuit 10 can be prevented from occurring.

On the other hand, the output signals of the inverter circuits 6 and 7 generated based on the ON and OFF signals output from the pulse generating circuit 1 are sent to the flip-flop circuit 10 by setting the pulse widths of the ON and OFF signals output from the pulse generating circuit 1 much greater than the application time for the dv/dt transient signal, that is, greater than the lag time caused by the filter circuit. Consequently, the flip-flop circuit 10 is normally operated.

Referring to the high potential side power device driving circuit HD according to the prior art described above, the resistance values of the resistors 4 and 5 and the ON-state resistances of the HNMOS transistors 2 and 3 are set in such a manner that the voltage drop of the resistors 4 and 5 caused by the dv/dt transient signal can be distinguished from the voltage drop caused by the signal sent from the pulse generating circuit 1, so that the malfunction can be prevented from occurring due to the dv/dt transient signal. However, setting should be performed with high precision. Accordingly, when a margin for the ability to prevent the malfunction for the change of the dv/dt transient signal is decreased and the dv/dt transient signal is increased, setting cannot be performed theoretically. Actually, a semiconductor apparatus has been developed in such a manner that the dv/dt transient signal is increased.

In the high potential side power device driving circuit HD1 according to the prior art, it is necessary to set the pulse widths of the ON and OFF signals output from the pulse generating circuit 1 much greater than the application time for the dv/dt transient signal. The switching operation of the power device is limited by the dv/dt transient signal, and the output signals of the inverter circuits 6 and 7 are sent to the flip-flop circuit 10 later by the lag time set by the filter circuit 26. Consequently, the response performance of the power device 17 is lowered. Accordingly, the driving circuit HD1 is nor suitable for the power device which requires high-speed operation.

Such operation will be described with reference to a timing charts shown in FIG. 10A to FIG. 10E. When the power device 17 is turned ON, the pulse generating circuit 1 outputs a "H" signal as an ON signal and a "L" signal as an OFF signal. The inverter circuit 7 outputs the "H" signal. The output of the ON side CR filter circuit which receives the "H" signal gradually rises until charges are filled in the capacitor 25. The output of the ON side CR filter circuit falls in the same manner. When the output of the ON side CR filter circuit completely rises, the "H" signal is output from the Q output of the flip-flop circuit 10.

When the power device 17 is turned OFF, the pulse generating circuit 1 outputs a "L" signal as an ON signal and a "H" signal as an OFF signal. Then, the inverter circuit 6 outputs the "H" signal. The output of the OFF side CR filter circuit which receives the "H" signal gradually rises until the capacitor 24 is charged. The output of the OFF side CR filter circuit falls in the same manner. When the output of the OFF side CR filter circuit completely rises, the "L" signal is output from the Q output of the flip-flop circuit 10.

Accordingly, the power device 17 is kept ON while the "H" signal is output from the Q output of the flip-flop circuit 10. The period is longer by the lag times of the ON and OFF side CR filter circuits as compared with the case where the filter circuit 26 is not provided.

If the dv/dt transient signal is applied, the dv/dt current flows to the HNMOS transistors 2 and 3 at the same time. A voltage drop occurs to the resistors 4 and 5 at the same time so that the "H" signal is output from the inverter circuits 6 and 7. While the dv/dt transient signal is applied, the capacitors 25 and 24 of the ON and OFF side CR filter circuits cannot be charged completely. For this reason, the outputs of the ON and OFF side CR filter circuits do not reach a level at which a malfunction occurs to the flip-flop circuit 10.

In order to set the lag time accurately, it is necessary to set the rated values of the resistors 22 and 23 and the capacitors 24 and 25 with high precision. In particular, in the case where the resistors and capacitors are used for an integrated circuit (IC), the temperature dependency of the rated value and a variation in rated value caused by manufacture should be considered. Hence, it is very hard to set the lag time accurately. In addition, the resistors and capacitors have great areas on the pattern of the integrated circuit. Consequently, integration cannot be enhanced due to the presence of the filter circuit 26.

The power device 17 is operated by the edge trigger of the pulse-shaped ON and OFF signals in order to confine power consumption to the minimum. The above problems are peculiar to a system for operating the power device 17 by the edge trigger of the pulse-shaped ON and OFF signals.

SUMMARY OF THE INVENTION

A first aspect of the present invention is directed to a semiconductor apparatus comprising first and second switching devices which are connected in series and inserted between first and second main source potentials, control means provided with power source means in which the potential of the node of the first and second switching devices acts as a reference for controlling the conductive state of the first switching device, pulse generating means for generating first and second pulse signals having the same level in response to the positive and negative level transitions of an input signal generated by the second main source potential as a reference, and level shift means for level-shifting the first and second pulse signals to the potential side of the node of the first and second switching devices so as to obtain first and second level-shifted signals corresponding thereto, wherein the first pulse signal is an ON signal which brings the first switching device into the conductive state at a timing at which the first pulse signal is sent, and wherein the second pulse signal is an OFF signal which brings the first switching device into the non-conductive state at a timing at which the second pulse signal is sent, the level shift means comprising first and second semiconductor devices for level shift which are inserted between the first and second main source potentials, have a breakdown voltage characteristic that is more than a voltage obtained between the first and second main source potentials, and are controlled by the first and second pulse signals, the control means comprising control signal output means for outputting a control signal which keeps the first switching device in the conductive or non-conductive state based on the first and second level-shifted signals, and protecting means provided on the first stage of the control signal output means for sending a predetermined signal to the control signal output means so as to continuously output the last control signal when the first and second level-shifted signals are sent at the same time.

A second aspect of the present invention is directed to the semiconductor apparatus, wherein the level shift means further comprises first and second resistor elements connected between the respective main electrodes of the first and second semiconductor devices for level shift and the output of the power source means, the respective main electrodes of the first and second semiconductor devices for level shift being connected to the node of the first and second switching devices.

A third aspect of the present invention is directed to the semiconductor apparatus, wherein the control signal output means is a flip-flop circuit, and wherein the protecting means is formed by a combinational logic circuit which sends an output holding signal as the predetermined signal to the set and reset inputs of the flip-flop circuit when the first and second level-shifted signals are sent at the same time.

A fourth aspect of the present invention is directed to the semiconductor apparatus, wherein the protecting means comprises a first inverter circuit to which the first level-shifted signal is input, a second inverter circuit to which the second level-shifted signal is input, a NOR circuit to which the outputs of the first and second inverter circuits are input, a third inverter circuit to which the output of the first inverter circuit is input, a fourth inverter circuit to which the output of the NOR circuit is input, a fifth inverter circuit to which the output of the second inverter circuit is input, a first NAND circuit to which the outputs of the third and fourth inverter circuits are input, and a second NAND circuit to which the outputs of the fourth and fifth inverter circuits are input.

A fifth aspect of the present invention is directed to the semiconductor apparatus, wherein the protecting means further comprises a sixth inverter circuit to which the output of the first NAND circuit is input, and a seventh inverter circuit to which the output of the second NAND circuit is input.

A sixth aspect of the present invention is directed to the semiconductor apparatus, wherein the protecting means comprises a NAND circuit to which the first and second level-shifted signals are input, at least one first inverter circuit to which the first level-shifted signal is input, a second inverter circuit to which the output of the NAND circuit is input, at least one third inverter circuit to which the second level-shifted signal is input, a first NOR circuit to which the outputs of the at least one first inverter circuit and the second inverter circuit are input, and a second NOR circuit to which the outputs of the second inverter circuit and the at least one third inverter circuit are input.

A seventh aspect of the present invention is directed to the semiconductor apparatus, wherein said at least one first and third inverter circuit includes a plurality of first and third inverter circuits, the number thereof being determined by the signal processing time of the NAND circuit.

An eighth aspect of the present invention is directed to the semiconductor apparatus, wherein the protecting means comprises an EXNOR circuit to which the first and second level-shifted signals are input, a first inverter circuit to which the output of the EXNOR circuit is input, a first NAND circuit to which the first level-shifted signal and the output of the first inverter circuit are input, a second NAND circuit to which the second level-shifted signal and the output of the first inverter circuit are input, a second inverter circuit to which the output of the first NAND circuit is input, and a third inverter circuit to which the output of the second NAND circuit is input.

According to the first aspect of the present invention, also in the case where the first and second level-shifted signals are sent simultaneously due to the dv/dt transient signal generated when operating the first and second switching devices, that is, also in case of emergency where the ON and OFF signals are sent at the same time, the protecting means sends a predetermined signal to the control signal output means so as to continuously output the last control signal. Consequently, a malfunction, that is, the undefined output of the control signal output means can be prevented from occurring. Furthermore, the first and second switching devices can be protected.

According to the second aspect of the present invention, also in the semiconductor apparatus having a possibility that the dv/dt transient signal generated during the operation of the first and second switching devices is sent to the first main electrodes of the first and second semiconductor devices for level shift, a dv/dt current flows to the first and second semiconductor devices for level shift at the same time by the dv/dt transient signal and the parasitic electrostatic capacity of the first and second semiconductor devices for level shift, and the first and second level-shifted signals are sent at the same time, for example, the driving circuit of a power device such as the first and second switching devices, the protecting means sends a predetermined signal to the control signal output means so as to continuously output the last control signal. Consequently, the malfunction such as the undefined output of the control signal output means can be prevented from occurring. Furthermore, the first and second switching devices can be protected.

According to the third aspect of the present invention, the control signal output means is a flip-flop circuit and the protecting means is formed by a combinational logic circuit which sends an output holding signal as a predetermined signal to the set and reset inputs of the flip-flop circuit when the first and second level-shifted signals are sent at the same time. Consequently, the pulse widths of signals input to the gate electrodes of the first and second semiconductor devices for level shift can be set optionally as compared with the semiconductor apparatus using a CR filter circuit or the like according to the prior art. In addition, the lag time of the signal is not caused by a passage through the CR filter circuit. Thus, the malfunction of the flip-flop circuit can be prevented without lowering the response performance of the switching device.

According to the fourth aspect of the present invention, when the first and second level-shifted signals are sent at the same time, a signal having a first potential level is simultaneously output from the first and second NAND circuits of the protecting means and a signal having a second potential level which is reverse to the first potential level is not output. Consequently, the malfunction of the flip-flop circuit can be prevented by means of the flip-flop circuit in which the output is held by the signal having the first potential level that is sent to the set and reset inputs at the same time.

According to the fifth aspect of the present invention, when the first and second level-shifted signals are sent at the same time, the signal having the second potential level which is reverse to the first potential level of the signal that is simultaneously output from the first and second NAND circuits is output from the sixth and seventh inverter circuits. Consequently, it is easy to obtain the protecting means suitable for the flip-flop circuit in which the output is held by the signal having the second potential level that is sent to the set and reset inputs at the same time.

According to the sixth aspect of the present invention, when the first and second level-shifted signals are sent at the same time, the signal having the first potential level is simultaneously output from the first and second NOR circuits and the signal having the second potential level which is reverse to the first potential level is not output. Consequently, it is possible to obtain the protecting means having a simpler structure that is suitable for the flip-flop circuit in which the output is held by the signal having the first potential level sent to the set and reset inputs at the same time.

According to the seventh aspect of the present invention, a plurality of first and third inverter circuits are provided based on the signal processing time of the NAND circuit. Consequently, it is possible to obtain the practical protecting means in which a time difference is not generated between a signal that passes through the NAND circuit and a signal that passes through the first and third inverter circuits and nonconformity can be prevented from occurring to the outputs of the first and second NOR circuits.

According to the eighth aspect of the present invention, when the first and second level-shifted signals are sent at the same time, the signal having the first potential level is simultaneously output from the first and second inverter circuits and the signal having the second potential level which is reverse to the first potential level is not output. Consequently, it is possible to obtain the protecting means having a simpler structure that is suitable for the flip-flop circuit in which the output is held by the signal having the first potential level sent to the set and reset inputs at the same time.

In order to solve the above problems, it is an object of the present invention to provide a high potential side power device driving circuit in which the pulse widths of signals input to the gate electrodes of transistors for level shift can be optionally set, the lag time of the signal is not caused by a passage through a filter circuit and the malfunction of the flip-flop circuit can be prevented from occurring due to a dv/dt current without lowering the response performance of a power device.

These and other objects, features, aspects and advantages of the present invention will become more apparent from the following detailed description of the present invention when taken in conjunction with the accompanying drawings.

DESCRIPTION OF THE PREFERRED EMBODIMENTS

<A. First Embodiment>
<A-1. Structure of Apparatus>

Figure 1:
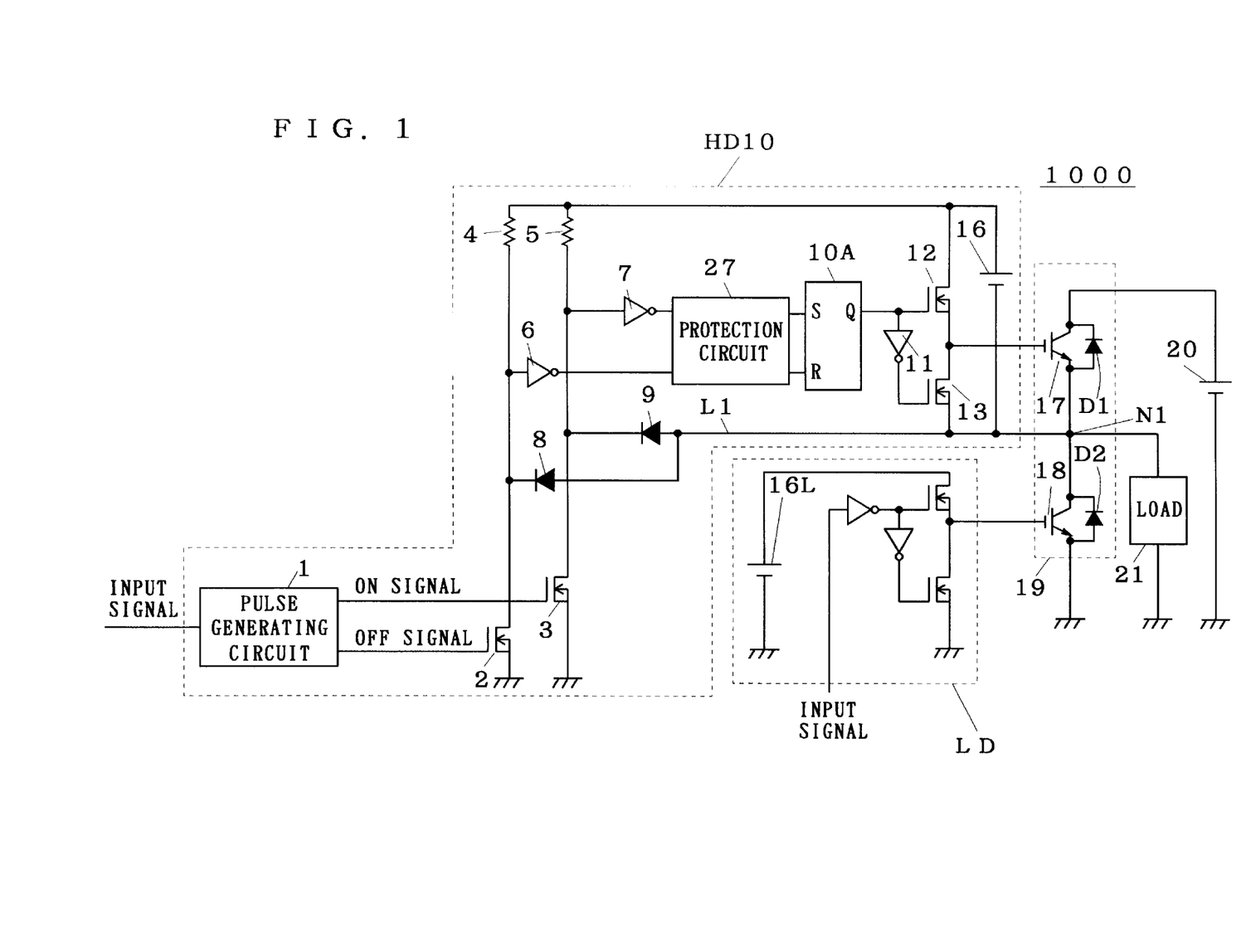
FIG. 1 is a diagram showing the structure of a semiconductor apparatus according to a first embodiment of the present invention.

FIG. 1 shows the structure of a driving circuit 1000 of a power device in a semiconductor apparatus according to a first embodiment of the present invention. In FIG. 1, power devices 17 and 18 such as IGBTs (insulated gate bipolar transistors) are Totem-pole connected between a source potential VDD and a ground potential GND so that a half bridge type power device 19 is formed. Free-wheel diodes D1 and D2 are connected to the power devices 17 and 18 in antiparallel. A load (an inductive load such as a motor) 21 is connected to a node N1 of the power devices 17 and 18.

In FIG. 1, when the potential of the node N1 of the power devices 17 and 18 acts as a reference potential, the power device 17 performs switching operation between the reference potential and the source potential VDD supplied from a power source 20. The power device 17 will be hereinafter referred to as a high potential side power device.

When the ground potential acts as a reference potential, the power device 18 performs switching operation between the reference potential and the potential of the node N1. The power device 18 will be hereinafter referred to as a low potential side power device.

Accordingly, the driving circuit 1000 of the power device shown in FIG. 1 is divided into a high potential side power device driving circuit HD10 and a low potential side power device driving circuit LD. Since the low potential side power device driving circuit LD is hardly related to the present invention, the description will be omitted.

The structure of the high potential side power device driving circuit HD10 of the driving circuit 1000 of the power device will be described below.

In FIG. 1, the high potential side power device driving circuit HD10 comprises a high potential side power source 16 which acts as a power source thereof, and NMOS transistors 12 and 13 connected between the positive and negative potential outputs of the high potential side power source 16 in series. The NMOS transistors 12 and 13 are complementarily turned ON and OFF so that the power device 17 is switched.

The high potential side power device driving circuit HD10 has the following structure to drive the NMOS transistors 12 and 13.

The high potential side power device driving circuit HD10 comprises a pulse generating circuit 1 for generating pulse-shaped ON and OFF signals in response to positive and negative level transitions of a pulse-shaped input signal which is sent from a microcomputer or the like provided on the outside and generated by a ground potential as a reference. Two outputs of the pulse generating circuit 1 are connected to the gate electrodes of high breakdown voltage field effect transistors (hereinafter referred to as HNMOS transistors) 2 and 3 which act as level shift transistors. Accordingly, the ON signal is sent to the gate electrode of the HNMOS transistor 3 and the OFF signal is sent to the gate electrode of the HNMOS transistor 2.

The drain electrodes of the HNMOS transistors 2 and 3 are connected to the first ends of resistors 4 and 5, and to the inputs of inverter circuits 6 and 7 respectively.

The outputs of the inverter circuits 6 and 7 are connected to the inputs of a protection circuit 27. The outputs of the protection circuit 27 are connected to the set and reset inputs of a flip-flop circuit 10A. The protection circuit 27 serves to prevent the malfunction of the flip-flop circuit 10A from occurring and is formed by a logic gate to be described below.

The Q output of the flip-flop circuit 10A is connected to the gate electrode of an NMOS transistor 12 and to the input of an inverter circuit 11. The output of the inverter circuit 11 is connected to the gate electrode of an NMOS transistor 13.

The second ends of the resistors 4 and 5 are connected to the drain electrode side of the NMOS transistor 12, that is, the positive potential output of the high potential side power source 16. The source electrode of the NMOS transistor 13, that is, the negative potential output of the high potential side power source 16 is connected to the anodes of diodes 8 and 9. The cathodes of the diodes 8 and 9 are connected to the source electrodes of the HNMOS transistors 2 and 3 respectively. The diodes 8 and 9 serve to clamp the potential of the node N1. Transistors may be used in place of the diodes 8 and 9. In addition, the source electrodes of the HNMOS transistors 2 and 3 may be directly connected to the node N1 without diodes and transistors.

Figure 11:
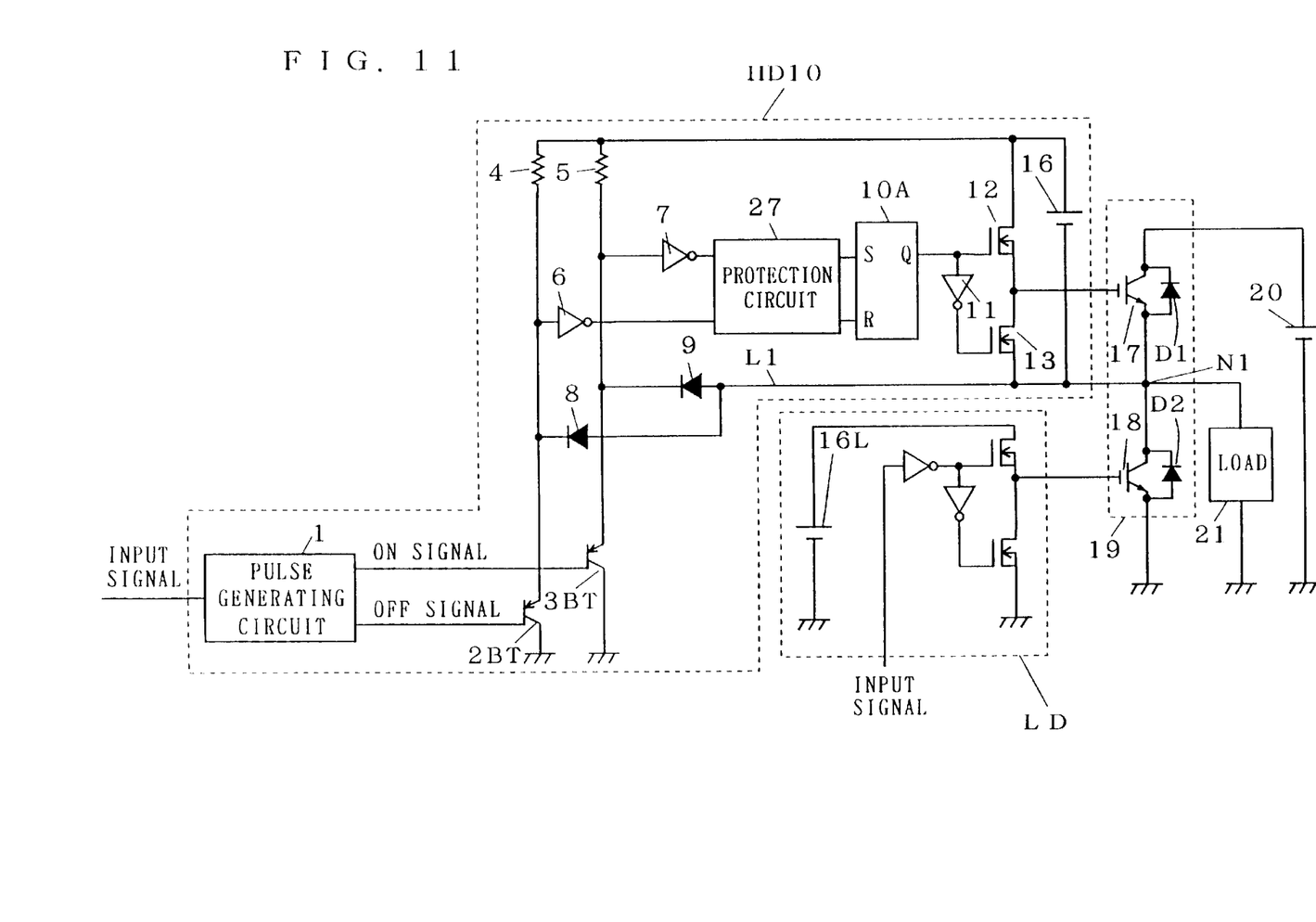
FIG. 11 is a diagram showing the structure of a semiconductor apparatus like that of FIG. 1 but with bipolar level shift transistors.

While the structure in which the high breakdown voltage field effect transistor is used as a level shift transistor has been described above, it is needles to say that a high breakdown voltage bipolar transistor can be used as the level shift transistor. FIG. 11 shows the structure which uses high breakdown voltage bipolar transistors 2BT and 3BT.

Figure 2:
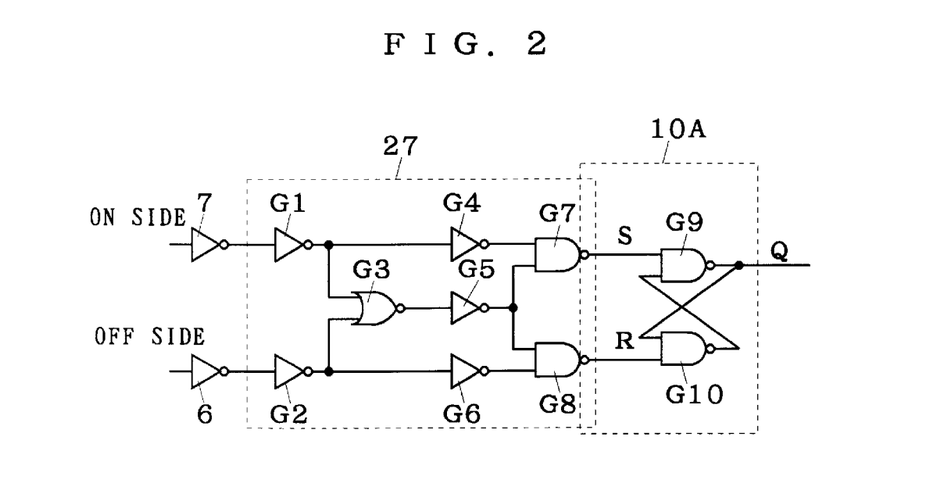
FIG. 2 is a diagram showing the structure of a protection circuit of the semiconductor apparatus according to the first embodiment of the present invention.
Figure 3A:
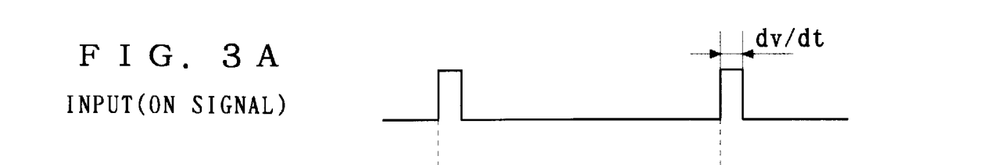
FIG. 3A to FIG. 3D are timing charts showing the operation of the semiconductor apparatus according to the first embodiment of the present invention.
Figure 3B:
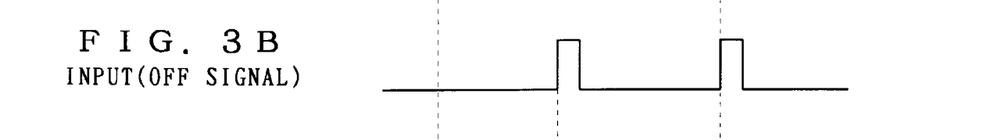
Figure 3C:
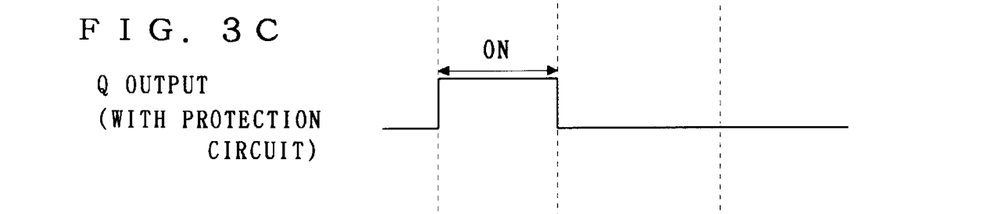
Figure 3D:
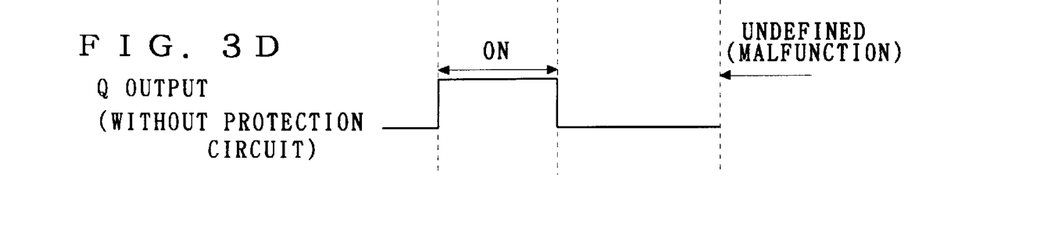

The structure of the protection circuit 27 will be described below with reference to FIG. 2. In FIG. 2, the outputs of the inverter circuit 7 (hereinafter referred to as "ON side" in the drawings because it is connected to the HNMOS transistor 3 to which the ON signal is input) and the inverter circuit 6 (hereinafter referred to as "OFF side" in the drawings because it is connected to the HNMOS transistor 2 to which the OFF signal is input) are connected to the inputs of inverter circuits G1 and G2 respectively. The outputs of the inverter circuits G1 and G2 are connected to the inputs of a NOR circuit G3 and to the inputs of inverter circuits G4 and G6. The output of the NOR circuit G3 is connected to the input of an inverter circuit G5.

The outputs of the inverter circuits G4 and G6 are connected to the first inputs of NAND circuits G7 and G8 respectively. The output of the inverter circuit G5 is connected to the second inputs of the NAND circuits G7 and G8.

The flip-flop circuit 10A comprises NAND circuits G9 and G10. The output of the NAND circuit G9 is a Q output and connected to the first input of the NAND circuit G10. The output of the NAND circuit G10 is connected to the first input of the NAND circuit G9. The second inputs of the NAND circuits G9 and G10 are set and reset inputs and connected to the outputs of the NAND circuits G7 and G8 of the protection circuit 27.

While the high potential side power source 16 is drawn as an independent power source in FIG. 1, it may have a structure in which a power is supplied from an insulating transformer that is provided on the outside or it may be a charge pump circuit formed by capacitors which are connected to the NMOS transistors 12 and 13 in parallel and diodes which are forward connected between the positive potential side of a low potential side power source 16L provided in a low potential side power device driving circuit LD and the source electrode side of the NMOS transistor 12.

<A-2. Operation of Apparatus>

The operation of the high potential side power device driving circuit HD10 will be described below with reference to FIGS. 1 and 2.

In the case where the power device 17 is turned ON, "H (high potential)" and "L (low potential)" signals are input as ON and OFF signals from the pulse generating circuit 1 respectively so that the HNMOS transistor 2 is turned OFF and the HNMOS transistor 3 is turned ON. Consequently, a voltage drop occurs to the resistor 5 connected to the HNMOS transistor 3, and the "L" signal is input to the inverter circuit 7. Since the voltage drop does not occur to the resistor 4 connected to the HNMOS transistor 2, the "H" signal is input to the inverter circuit 6. Accordingly, the inverter circuit 7 outputs the "H" signal and the inverter circuit 6 outputs the "L" signal.

The output of the inverter circuit 7 is inverted to the "L" signal by the inverter circuit G1 of the protection circuit 27. The output of the inverter circuit 6 is inverted to the "H" signal by the inverter circuit G2 of the protection circuit 27. Accordingly, the "L" signal is output from the NOR circuit G3.

The "H" signal is output from the inverter circuit G4. The "H" signal is output from the inverter circuit G5. The "L" signal is output from the inverter circuit G6.

Accordingly, the "H" signal is input to the two inputs of the NAND circuit G7 so that the "L" signal is output from the NAND circuit G7. The "H" and "L" signals are input to the two inputs of the NAND circuit G8 respectively so that the "H" signal is output from the NAND circuit G8.

The flip-flop circuit 10A is an inverted input type circuit. Hence, when the "L" and "H" signals are sent to the set and reset inputs respectively, the "H" signal is output from the Q output. The "H" signal is input to the gate electrode of the NMOS transistor 12 so that the NMOS transistor 12 is turned ON. The "L" signal is input to the gate electrode of the NMOS transistor 13 through the inverter circuit 11 so that the NMOS transistor 13 is turned OFF. Consequently, the power device 17 is turned ON so that a power is supplied to the load 21.

In the case where the power device 17 is turned OFF, "L" and "H" signals are output as ON and OFF signals from the pulse generating circuit 1 respectively. Consequently, the HNMOS transistor 2 is turned ON and the HNMOS transistor 3 is turned OFF.

Consequently, a voltage drop occurs to the resistor 4 connected to the HNMOS transistor 2 so that the "L" signal is input to the inverter circuit 6. Since the voltage drop does not occur to the resistor 5 connected to the HNMOS transistor 3, the "H" signal is input to the inverter circuit 7. Accordingly, the inverter circuit 6 outputs the "H" signal and the inverter circuit 7 outputs the "L" signal.

The output of the inverter circuit 7 is inverted to the "H" signal by the inverter circuit G1 of the protection circuit 27. The output of the inverter circuit 6 is inverted to the "L" signal by the inverter circuit G2 of the protection circuit 27. Accordingly, the "L" signal is output from the NOR circuit G3.

The "L" signal is output from the inverter circuit G4. The "H" signal is output from the inverter circuit G5. The "H" signal is output from the inverter circuit G6.

Accordingly, the "L" and "H" signals are input to the two inputs of the NAND circuit G7 respectively so that the "H" signal is output from the NAND circuit G7. The "H" signal is input to the two inputs of the NAND circuit G8 so that the "L" signal is output from the NAND circuit G8.

The flip-flop circuit 10A is an inverted input type circuit. Hence, when the "L" and "H" signals are sent to the set and reset inputs respectively, the "L" signal is output from the Q output. The "H" signal is input to the gate electrode of the NMOS transistor 13 through the inverter circuit 11 so that the NMOS transistor 13 is turned ON. The "L" signal is input to the gate electrode of the NMOS transistor 12 so that the NMOS transistor 12 is turned OFF. Consequently, the power device 17 is turned OFF so that a power is not supplied to the load 21.

The operation performed in the state where a dv/dt transient signal is applied will be described below. When the dv/dt transient signal is applied to a line L1, a dv/dt current which is obtained by integration of a parasitic electrostatic capacity C that is present between the drain-source of the HNMOS transistors 2 and 3 and the dv/dt transient signal flows to the HNMOS transistors 2 and 3 at the same time based on the parasitic electrostatic capacity C. The dv/dt current has the same level as that of a current which flows during normal switching. Consequently, a voltage drop occurs to the resistors 4 and 5 at the same time so that the "H" signal is output from the inverter circuits 7 and 6. In other words, the dv/dt transient signal is sent simultaneously in place of the ON and OFF signals.

The output of the inverter circuit 7 is inverted to the "L" signal by the inverter circuit G1 of the protection circuit 27. The output of the inverter circuit 6 is inverted to the "L" signal by the inverter circuit G2 of the protection circuit 27. Accordingly, the "H" signal is output from the NOR circuit G3.

The "H" signal is output from the inverter circuit G4. The "L" signal is output from the inverter circuit G5. The "H" signal is output from the inverter circuit G6.

Accordingly, the "H" and "L" signals are sent to the two inputs of the NAND circuit G7 respectively so that the "H" signal is output. In addition, the "H" and "L" signals are sent to the two inputs of the NAND circuit G8 respectively so that the "H" signal is output.

The flip-flop circuit 10A is an inverted input type circuit. Hence, the "H" signal is sent to the set and reset inputs so that neither a set signal nor a reset signal is input. Consequently, the Q output is kept in the prior state so that the power device 17 is also kept in the prior state.

Such operation will be described with reference to a timing chart shown in FIG. 3A to FIG. 3D. In FIG. 3A to FIG. 3D, when the "H" and "L" signals are input as ON and OFF signals respectively, the Q output of the flip-flop circuit 10A outputs the "H" signal through the protection circuit 27 at a timing at which the ON signal is sent. When the "L" and "H" signals are input as the ON and OFF signals respectively, the Q output of the flip-flop circuit 10A outputs the "L" signal through the protection circuit 27 at a timing at which the OFF signal is sent.

This operation is the same as that of the high potential side power device driving circuit 100 according to the prior art. In the case where the dv/dt transient signal is sent at the same time in place of the ON and OFF signals, the Q output of the flip-flop circuit 10A is kept in the prior state, that is, keeps the "L" signal as described above. In the high potential side power device driving circuit 100 having no protection circuit 27 according to the prior art, a malfunction occurs so that the Q output of the flip-flop circuit 10 becomes undefined.

<A-3. Characteristic Function and Effect>

Referring to the semiconductor apparatus according to the first embodiment of the present invention, the input stage of the flip-flop circuit 10A comprises the protection circuit 27 formed by a logic gate. Consequently, also in the case where the dv/dt transient signal is applied, a noise can be eliminated logically and a malfunction such as the undefined operation of the flip-flop circuit 10A can be prevented from occurring. In addition, the power device 17 is turned ON simultaneously with the power device 18 so that the power devices 17 and 18 can be protected against the breakdown caused by a through current which passes through the power devices 17 and 18 from the power source 20.

The pulse widths of signals input to the gate electrodes of the HNMOS transistors can be set optionally and the lag time of the signal is not caused by a passage through the protection circuit 27. Consequently, it is possible to obtain the high potential side power device driving circuit which does not lower the response performance of the power device.

Furthermore, the protection circuit 27 has neither a capacitor nor a resistor which should be set with high precision. Consequently, the circuit design can be simplified considerably.

<B. Second Embodiment>
<B-1. Structure of Apparatus>

Figure 4:
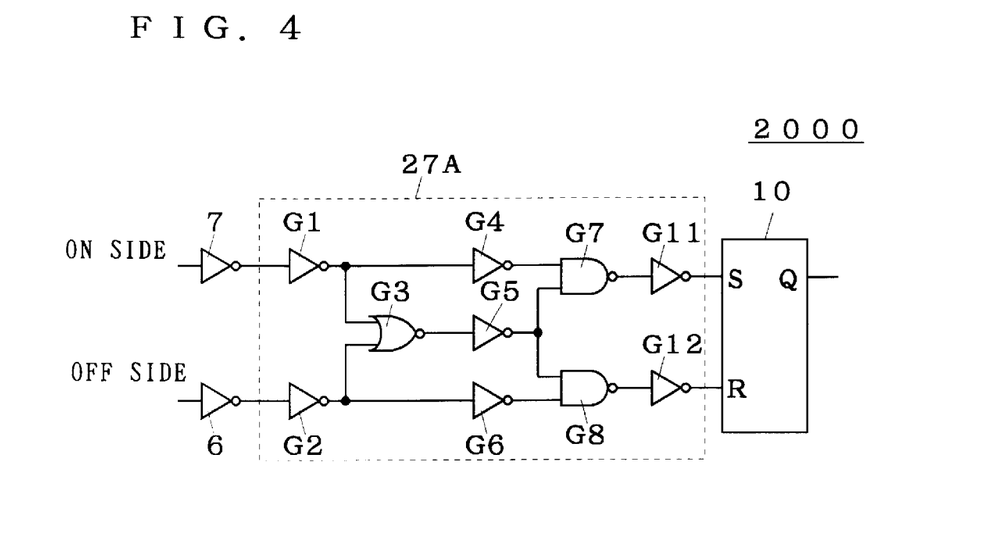
FIG. 4 is a diagram showing the structure of a protection circuit of a semiconductor apparatus according to a second embodiment of the present invention.

As a semiconductor apparatus according to a second embodiment of the present invention, FIG. 4 shows the structure of a protection circuit 27A provided in the high potential side power device driving circuit of a driving circuit 2000 of a power device. Since the structure of the driving circuit 2000 of the power device other than the protection circuit 27A is the same as that of the driving circuit 1000 of the power device except that the inverted input type flip-flop circuit 10A of the driving circuit 1000 of the power device described in the first embodiment is replaced with a non-inverted input type flip-flop circuit 10, the description will be omitted. The non-inverted input type flip-flop circuit 10 has a general structure in which the NAND circuits G9 and G10 of the inverted input type flip-flop circuit 10A described with reference to FIG. 2 are replaced with NOR circuits, which are not shown.

<B-2. Operation of Apparatus>

In FIG. 4, the protection circuit 27A is connected to the input stage of the non-inverted input type flip-flop circuit 10. While the structure of the protection circuit 27A is almost the same as that of the protection circuit 27 described with reference to FIG. 2, inverter circuits G11 and G12 are connected to the outputs of NAND circuits G7 and G8 respectively. Accordingly, the outputs of the protection circuit 27A are inverted to those of the protection circuit 27. In the case where a dv/dt transient signal is applied, the inverter circuits G11 and G12 output "L" signals. The "L" signals are sent to the set and reset inputs of the non-inverted input type flip-flop circuit 10 so that neither a set signal nor a reset signal is input. Consequently, a Q output is kept in the prior state and a power device 17 is also kept in the prior state.

<B-3. Characteristic Function and Effect>

By using the protection circuit 27A having the above structure, in the case where the dv/dt transient signal is applied to the driving circuit 2000 of the power device having the non-inverted input type flip-flop circuit 10, a noise can be eliminated logically and a malfunction such as the undefined operation of the flip-flop circuit 10 can be prevented from occurring.

<C. Third Embodiment>
<C-1. Structure of Apparatus>

Figure 5:
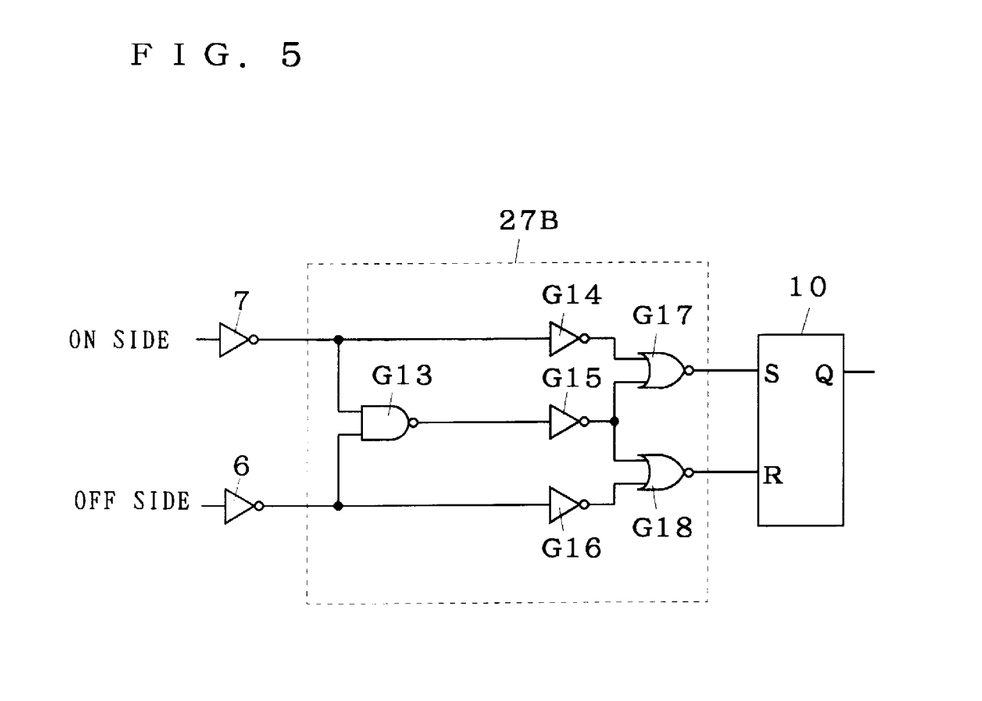
FIG. 5 is a diagram showing the structure of a protection circuit of a semiconductor apparatus according to a third embodiment of the present invention.

As a semiconductor apparatus according to a third embodiment of the present invention, FIG. 5 shows the structure of a protection circuit 27B provided in the high potential side power device driving circuit of a driving circuit 3000 of a power device. Since the structure of the driving circuit 3000 of the power device other than the protection circuit 27B is the same as that of the driving circuit 1000 of the power device except that the inverted input type flip-flop circuit 10A of the driving circuit 1000 of the power device described in the first embodiment is replaced with a non-inverted input type flip-flop circuit 10, the description will be omitted.

In FIG. 5, the protection circuit 27B is connected to the input stage of the non-inverted input type flip-flop circuit 10. The outputs of inverter circuits 7 and 6 are connected to the inputs of a NAND circuit G13 and to the inputs of inverter circuits G14 and G16. The output of the NAND circuit G13 is connected to the input of an inverter circuit G15.

The outputs of the inverter circuits G14 and G16 are connected to the first inputs of NOR circuits G17 and G18 respectively. The output of the inverter circuit G15 is connected to the second inputs of the NOR circuits G17 and G18. The outputs of the NOR circuits G17 and G18 are connected to the set and reset inputs of the flip-flop circuit 10 respectively.

<C-2. Operation of Apparatus>

The operation of the protection circuit 27B having the above structure is the same as that of the protection circuit 27A described with reference to FIG. 4. The NAND circuit G13 is provided on the input side so that the inverter circuits G1 and G2 are not required. The NOR circuits G17 and G18 are provided on the output side so that the inverter circuits G11 and G12 are not required. Consequently, the structure of a circuit can be simplified.

Figure 6:
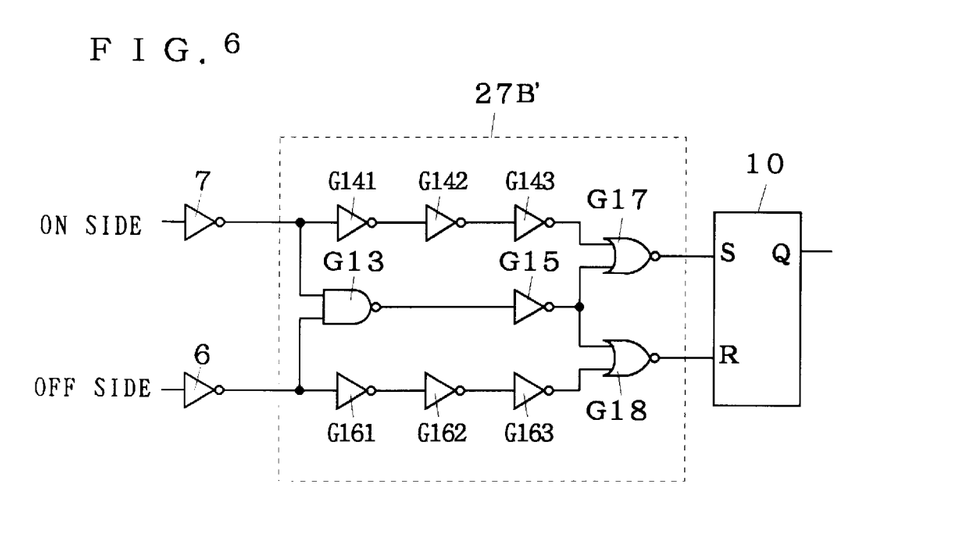
FIG. 6 is a diagram showing the more practical structure of the protection circuit of the semiconductor apparatus according to the third embodiment of the present invention.

FIG. 6 shows a protection circuit 27B' as the practical structure of the protection circuit 27B. In FIG. 6, inverter circuits G141, G142 and G143 which are connected in series are provided in place of the inverter circuit G14 shown in FIG. 5, and inverter circuits G161, G162 and G163 which are connected in series are provided in place of the inverter circuit G16.

<C-3. Characteristic Function and Effect>

According to such a structure, a signal input to the inverter circuit G143 through the inverter circuits G141 and G142 and a signal input to the inverter circuit G163 through the inverter circuits G161 and G162 are input to the NOR circuits G17 and G18 at the same timing as that of a signal input to the inverter circuit G15 through the NAND circuit G13. Consequently, the lag of the outputs of the NOR circuits G17 and G18 can be prevented from occurring due to a difference in signal path.

<D. Fourth Embodiment>
<D-1. Structure of Apparatus>

Figure 7:
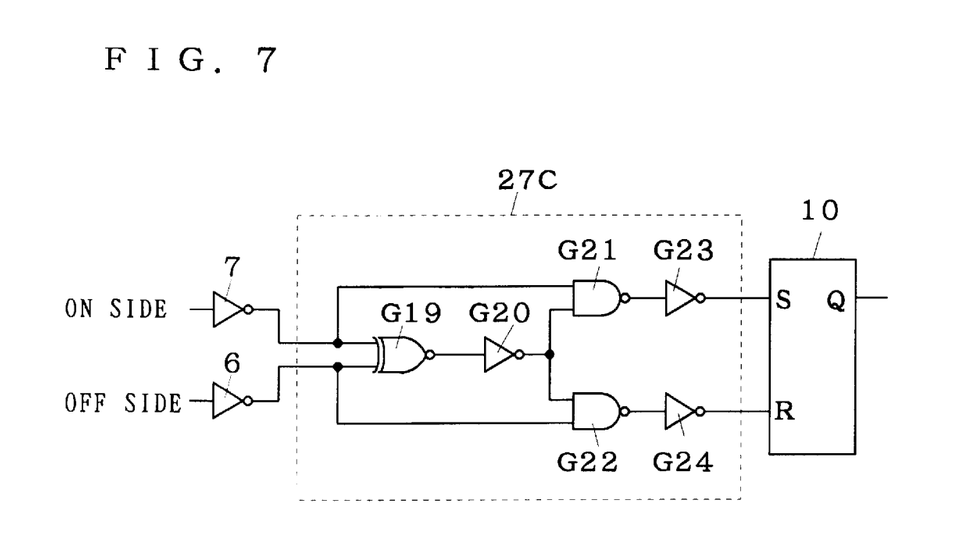
FIG. 7 is a diagram showing the structure of a protection circuit of a semiconductor apparatus according to a fourth embodiment of the present invention.

As a semiconductor apparatus according to a fourth embodiment of the present invention, FIG. 7 shows the structure of a protection circuit 27C provided in the high potential side power device driving circuit of a driving circuit 4000 of a power device. Since the structure of the driving circuit 4000 of the power device other than the protection circuit 27C is the same as that of the driving circuit 1000 of the power device except that the inverted input type flip-flop circuit 10A of the driving circuit 1000 of the power device described in the first embodiment is replaced with a non-inverted input type flip-flop circuit 10, the description will be omitted.

In FIG. 7, the protection circuit 27C is connected to the input stage of the non-inverted input type flip-flop circuit 10. The outputs of inverter circuits 7 and 6 are connected to the inputs of an EXNOR (exclusive NOR) circuit G19 and to the first inputs of NAND circuits G21 and G22 respectively. The output of the EXNOR circuit G19 is connected to the input of an inverter circuit G20. The output of the inverter circuit G20 is connected to the second inputs of the NAND circuits G21 and G22. The outputs of the NAND circuits G21 and G22 are connected to the inputs of inverter circuits G23 and G24 respectively. The outputs of the inverter circuits G23 and G24 are connected to the set and reset inputs of the flip-flop circuit 10 respectively.

<D-2. Characteristic Function and Effect>

The operation of the protection circuit 27C having the above structure is the same as that of the protection circuit 27A described with reference to FIG. 4. The EXNOR circuit G19 is provided on the input side so that the number of the inverter circuits can be reduced. Consequently, the structure of a circuit can be simplified.

<E. Variant of Preferred Embodiments>

The structure in which the malfunction can be prevented from occurring due to the dv/dt transient signal in the driving circuit of the power device has been described in the first to fourth embodiments of the present invention. If the semiconductor apparatus according to the present invention is a system for operating a switching device by the edge trigger of the pulse-shaped ON and OFF signals and has a possibility that the ON and OFF signals are sent simultaneously by the dv/dt transient signal, it can also be applied to a switching device having a small power, for example, the driving circuits of a MOS transistor and a bipolar transistor.

While the invention has been described in detail, the foregoing description is in all aspects illustrative and not restrictive. It is understood that numerous other modifications and variations can be devised without departing from the scope of the invention.

We claim:

1. A semiconductor apparatus comprising;

first and second switching devices connected together in series between a first main source potential and a second main source potential, a control portion provided with a power source in which a potential of a node of said first and second switching devices acts as a reference for controlling a conductive state of said first switching device, a pulse generator for generating first and second pulse signals having a same level in response to positive and negative level transitions of an input signal generated by said second main source potential as a reference, and a level shifter for level-shifting said first and second pulse signals to the potential side of the node of said first and second switching devices so as to obtain first and second level-shifted signals corresponding thereto, wherein said first pulse signal is an ON signal which brings said first switching device into a conductive state at a timing at which said first pulse signal is sent, and wherein said second pulse signal is an OFF signal which brings said first switching device into a non-conductive state at a timing at which said second pulse signal is sent, said level shifter comprising;

first and second semiconductor devices for level shift which are connected between said first main source potential and said second main source potential, have a breakdown voltage characteristic that is more than a voltage obtained between said first main source potential and said second main source potential, and are controlled by said first and second pulse signals, said control portion comprising, a control signal output device for outputting a control signal which keeps said first switching device in the conductive or non-conductive state based on said first and second level-shifted signals, and a protecting circuit provided on a first stage of said control signal output device for sending a predetermined signal to said control signal output device so that the control signal continuously maintains a voltage level which is of a level before said first and second level-shifted signals were sent at a same time, when said first and second level-shifted signals are sent at a same time as a result of transient signals which occur transiently when said first and second switching devices are switched.

2. The semiconductor apparatus according to claim 1, wherein said level shifter further comprises;

first and second resistor elements connected between respective main electrodes of said first and second semiconductor devices for level shift and the output of said power source, the respective main electrodes of said first and second semiconductor devices for level shift being connected to the node of said first and second switching devices.

3. The semiconductor apparatus according to claim 1, wherein said control signal output device is a flip-flop circuit, and wherein said protecting circuit is formed by a combinational logic circuit which sends an output holding signal as said predetermined signal to the set and reset inputs of said flip-flop circuit when said first and second level-shifted signals are sent at the same time.

4. The semiconductor apparatus according to claim 3, wherein said protecting circuit comprises;

a first inverter circuit to which said first level-shifted signal is input, a second inverter circuit to which said second level-shifted signal is input, a NOR circuit to which the outputs of said first and second inverter circuits are input, a third inverter circuit to which the output of said first inverter circuit is input, a fourth inverter circuit to which the output of said NOR circuit is input, a fifth inverter circuit to which the output of said second inverter circuit is input, a first NAND circuit to which the outputs of said third and fourth inverter circuits are input, and a second NAND circuit to which the outputs of said fourth and fifth inverter circuits are input.

5. The semiconductor apparatus according to claim 4, wherein said protecting circuit further comprises;

a sixth inverter circuit to which the output of said first NAND circuit is input, and a seventh inverter circuit to which the output of said second NAND circuit is input.

6. The semiconductor apparatus according to claim 3, wherein said protecting circuit comprises;

a NAND circuit to which said first and second level-shifted signals are input, at least one first inverter circuit to which said first level-shifted signal is input, a second inverter circuit to which the output of said NAND circuit is input, at least one third inverter circuit to which said second level-shifted signal is input, a first NOR circuit to which the outputs of said at least one first inverter circuit and said second inverter circuit are input, and a second NOR circuit to which the outputs of said second inverter circuit and said at least one third inverter circuit are input.

7. The semiconductor apparatus according to claim 6, wherein said at least one first and third inverter circuit includes a plurality of first and third inverter circuits, the number thereof being determined by the signal processing time of said NAND circuit.

8. The semiconductor apparatus according to claim 3, wherein said protecting circuit comprises;

an EXNOR circuit to which said first and second level-shifted signals are input, a first inverter circuit to which the output of said EXNOR circuit is input, a first NAND circuit to which said first level-shifted signal and the output of said first inverter circuit are input, a second NAND circuit to which said second level-shifted signal and the output of said first inverter circuit are input, a second inverter circuit to which the output of said first NAND circuit is input, and a third inverter circuit to which the output of said second NAND circuit is input.

9. The semiconductor apparatus according to claim 1, wherein said first and second semiconductor devices for level shift are MOSFETs.

10. The semiconductor apparatus according to claim 1, wherein said first and second semiconductor devices for level shift are bipolar transistors.

* * * * *